US 011488950B2

(12) United States Patent
Rana et al.

(10) Patent No.: US 11,488,950 B2
(45) Date of Patent: Nov. 1, 2022

(54) INTEGRATED CIRCUIT STRUCTURE AND METHOD FOR BIPOLAR TRANSISTOR STACK WITHIN SUBSTRATE

(71) Applicant: GLOBALFOUNDRIES U.S. Inc., Santa Clara, CA (US)

(72) Inventors: Uzma B. Rana, Slingerlands, NY (US); Vibhor Jain, Clifton Park, NY (US); Anthony K. Stamper, Burlington, VT (US); Qizhi Liu, Lexington, MA (US); Siva P. Adusumilli, South Burlington, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/173,611

(22) Filed: Feb. 11, 2021

(65) Prior Publication Data

US 2022/0254774 A1    Aug. 11, 2022

(51) Int. Cl.
*H01L 27/06*    (2006.01)
*H01L 29/732*    (2006.01)
(Continued)

(52) U.S. Cl.
CPC ...... *H01L 27/0623* (2013.01); *H01L 21/8249* (2013.01); *H01L 29/0804* (2013.01); *H01L 29/0817* (2013.01); *H01L 29/1004* (2013.01); *H01L 29/66234* (2013.01); *H01L 29/66242* (2013.01); *H01L 29/66287* (2013.01);
(Continued)

(58) Field of Classification Search
CPC ............. H01L 27/0623; H01L 21/8249; H01L 29/0804; H01L 29/0817; H01L 29/1004; H01L 29/66234; H01L 29/66242; H01L 29/66287; H01L 29/66318; H01L 29/73;
(Continued)

(56) References Cited

U.S. PATENT DOCUMENTS 4,252,581 A    2/1981    Anantha et al.
5,106,767 A *  4/1992    Comfort ............ H01L 21/28525
                                              257/E21.166
(Continued)

OTHER PUBLICATIONS

Deviny et al., "A Novel 1700V RET-IGBT (Recessed Emitter Trench IGBT) Shows Record Low Vce(oN), Enhanced Current Handling Capability and Short Circuit Robustness," Proceedings of the 29th International Symposium on Power Semiconductor Devices & ICs, Sapporo, 4 pages.
(Continued)

*Primary Examiner* — Shouxiang Hu
(74) *Attorney, Agent, or Firm* — Anthony Canale; Hoffman Warnick LLC

(57) ABSTRACT

Aspects of the disclosure provide an integrated circuit (IC) structure with a bipolar transistor stack within a substrate. The bipolar transistor stack may include: a collector, a base on the collector, and an emitter on a first portion of the base. A horizontal width of the emitter is less than a horizontal width of the base, and an upper surface of the emitter is substantially coplanar with an upper surface of the substrate. An extrinsic base structure is on a second portion of the base of the bipolar transistor stack, and horizontally adjacent the emitter. The extrinsic base structure includes an upper surface above the upper surface of the substrate.

12 Claims, 16 Drawing Sheets

(51) Int. Cl.
  *H01L 21/8249* (2006.01)
  *H01L 29/66* (2006.01)
  *H01L 29/10* (2006.01)
  *H01L 29/08* (2006.01)
  *H01L 29/737* (2006.01)
  *H01L 29/73* (2006.01)

(52) U.S. Cl.
  CPC ........ *H01L 29/66318* (2013.01); *H01L 29/73* (2013.01); *H01L 29/732* (2013.01); *H01L 29/737* (2013.01); *H01L 29/7325* (2013.01); *H01L 29/7375* (2013.01)

(58) Field of Classification Search
  CPC . H01L 29/732; H01L 29/7325; H01L 29/737; H01L 29/7375
  See application file for complete search history.

(56) References Cited

U.S. PATENT DOCUMENTS

| | | | |
|---|---|---|---|
| 6,501,153 B2* | 12/2002 | Oue | H01L 29/7322 257/E23.105 |
| 9,202,901 B2* | 12/2015 | Fu | H01L 29/66318 |
| 9,496,184 B2 | 11/2016 | Chang et al. | |
| 9,640,528 B2 | 5/2017 | Preisler et al. | |
| 9,859,382 B2 | 1/2018 | Stamper et al. | |
| 2014/0353725 A1* | 12/2014 | Adkisson | H01L 29/7371 438/318 |
| 2020/0066714 A1* | 2/2020 | Qiao | H01L 27/0635 |

OTHER PUBLICATIONS

P. Chevalier et al., "SiGe BiCMOS Current Status and Future Trends in Europe," IEEE BCICTS, Oct. 16, 2018, San Diego, CA, 33 pages.

P. Chevalier, "55nm SiGe BiCMOS for Optical, Wireless and High-Performance Analog Applications," European Microwave Week 2015, Sep. 6-11, 2015, 35 pages.

\* cited by examiner

INTEGRATED CIRCUIT STRUCTURE AND METHOD FOR BIPOLAR TRANSISTOR STACK WITHIN SUBSTRATE

TECHNICAL FIELD

Embodiments of the disclosure relate generally to integrated circuit (IC) structures. More specifically, various embodiments of the disclosure provide an IC structure with a bipolar transistor stack within a substrate, and related methods to form the same.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, transistors, resistors, capacitors, etc. Circuit chips with millions of such devices are common.

One type of transistor architecture is the bipolar junction transistor (BJT). A BJT refers to a transistor formed of three adjacent semiconductor regions (respectively known as emitter, base, and collector) with alternating conductivity types (e.g., N-P-N or P-N-P). The BJT is distinct from other types of transistors by being a "current controlled device," and thus current transmitted to the base of the transistor controls current flow between emitter and collector. BJTs may take a variety of shapes, and may include vertically-stacked semiconductor layers (i.e., vertical BJT) or horizontally-planar arrays of semiconductor material (i.e., lateral BJT). An ongoing technical concern in the case of vertical BJTs is the ability to manufacture the BJT components at a scale similar to field effect transistors (FETs) that are formed on the same substrate. In conventional processing, the layers of a vertical BJT are vertically above a substrate and source/drain regions in a FET on the same substrate. This can create significant differences in the size of BJT and FET contacts, which may require larger interconnect regions and/or lead to degraded performance.

SUMMARY

Aspects of the present disclosure provide an integrated circuit (IC) structure, including: a bipolar transistor stack within a substrate, the bipolar transistor stack including: a collector, a base on the collector, and an emitter on a first portion of the base, wherein a horizontal width of the emitter is less than a horizontal width of the base, and an upper surface of the emitter is substantially coplanar with an upper surface of the substrate; and an extrinsic base structure on a second portion of the base of the bipolar transistor stack, and horizontally adjacent the emitter; wherein the extrinsic base structure includes an upper surface above the upper surface of the substrate.

Further aspects of the present disclosure provide an integrated circuit (IC) structure, including: a doped semiconductor region within a substrate; a first trench isolation (TI) horizontally adjacent the doped semiconductor region, a bipolar transistor stack within the substrate, over the doped semiconductor region, and adjacent the first trench isolation (TI) region, the bipolar transistor stack including a collector on the doped semiconductor region, a base on the collector, and an emitter on a first portion of the base, wherein a horizontal width of the emitter is less than a horizontal width of the base, and an upper surface of the emitter is substantially coplanar with an upper surface of the substrate; a first extrinsic base on a second portion of the base of the bipolar transistor stack and adjacent the first TI, wherein the first extrinsic base is horizontally adjacent the emitter; and a second extrinsic base on the first extrinsic base, wherein the second extrinsic base includes an upper surface above the upper surface of the substrate.

Yet another aspect of the present disclosure provides a method of forming an integrated circuit (IC) structure, the method including: forming a bipolar transistor stack within a substrate, the bipolar transistor stack including: a collector on the substrate, a base on the collector, and an emitter on a first portion of the base, wherein a horizontal width of the emitter is less than a horizontal width of the base, and an upper surface of the emitter is substantially coplanar with an upper surface of the substrate; forming an extrinsic base structure on a second portion of the base of the bipolar transistor stack, and horizontally adjacent the emitter, wherein the extrinsic base structure includes an upper surface above an upper surface of the substrate.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

Figure 1:
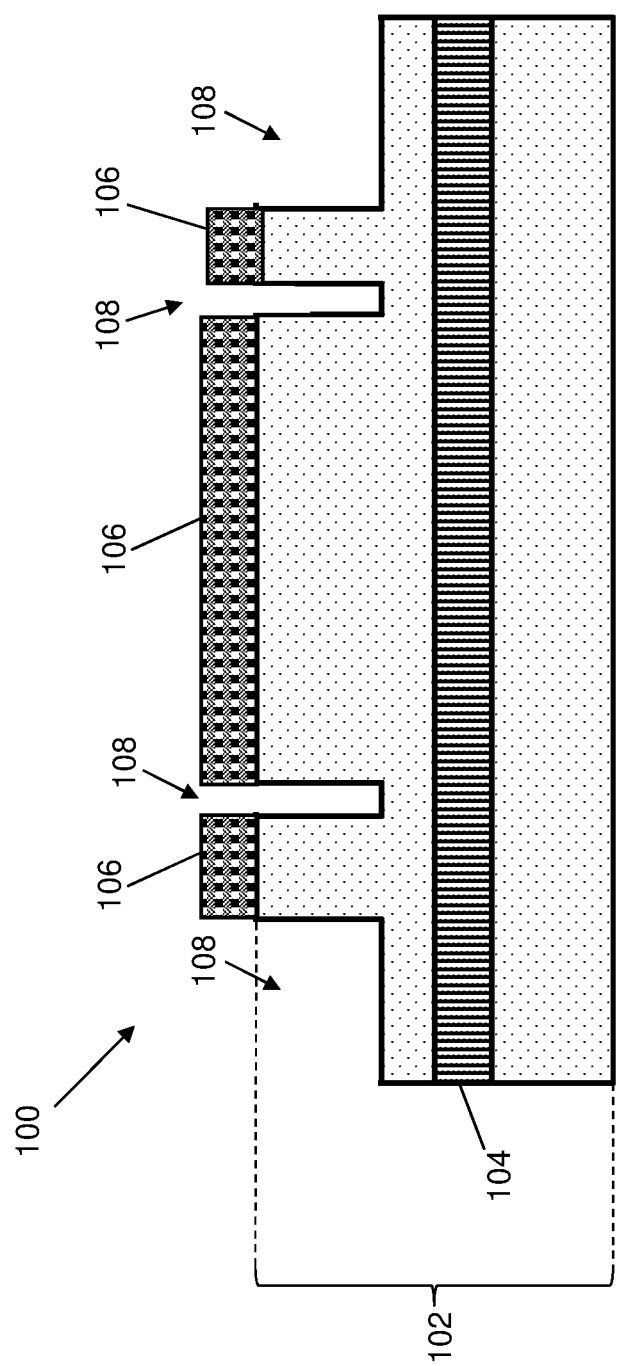
FIG. 1 provides a cross-sectional view of a preliminary structure to form an IC structure according to embodiments of the disclosure.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide an integrated circuit (IC) structure with a bipolar transistor stack within a substrate, and related methods to form the same. The bipolar transistor (BJT) stack could be, e.g., a NPN, PNP, heterojunction (HBT) NPN, or HBT PNP. Such a structure may include a doped semiconductor region within a substrate, and a bipolar transistor stack on the doped semiconductor region. The bipolar transistor stack includes a collector on the doped semiconductor region, as base on the collector, and an emitter on a portion of the base. A horizontal width of the emitter is less than a horizontal width of the base. A first extrinsic base is on another portion of the base, causing the first extrinsic base to be at least partially within the substrate and horizontally adjacent the emitter. Thus, the bipolar transistor stack and first extrinsic base are located at least partially within the substrate. A second extrinsic base is on the first extrinsic base and features an upper surface that is above an upper surface of the substrate. Thus, contacts can be formed to the emitter and base, as well as to the collector through the doped semiconductor region, at a scale similar to field effect transistor (FET) devices that are also formed on the substrate.

BJT structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction) but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials. IC structures according to the disclosure use doped semiconductor materials to create a BJT within a substrate for a device layer, while also providing extrinsic base structures that are located at least partially above the substrate. Forming extrinsic base structures above the upper of the substrate may enable greater device scalability, improved operational reliability, and easier integration of vertical BJTs into an IC layout.

Referring to FIG. 1, a preliminary structure 100 (simply "structure" hereafter) suitable to form an IC structure according to embodiments of the disclosure is shown. Preliminary structure 100 may be processed as described herein to yield one or more vertical BJT structures with an extrinsic base at least partially above a substrate. However, it is understood that other techniques, ordering of processes, etc., may be implemented to yield the same BJT structure(s) or similar BJT structures in further embodiments. FIG. 1 shows a cross-sectional view of structure 100 with a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained.

Figure 15:
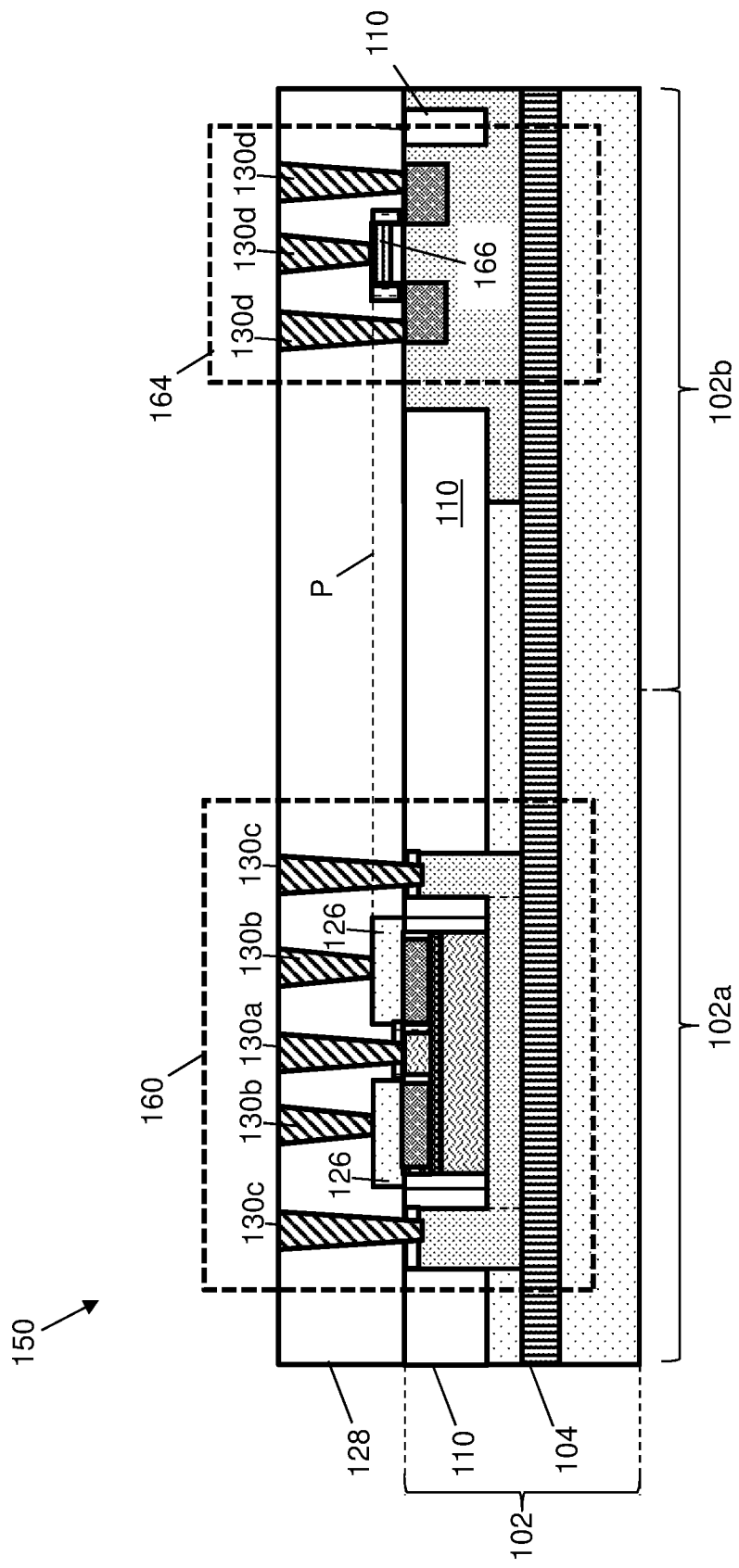
FIG. 15 provides a cross-sectional view of a bipolar transistor and FET in an IC structure according to embodiments of the disclosure.

Substrate 102 optionally may include embedded elements for electrically separating active materials formed thereon from other regions and/or materials within substrate 102. A resistive region 104 may be formed within substrate 102, e.g., by converting silicon material within substrate 102 into a higher-resistive material such as polycrystalline or amorphous silicon (poly-Si). Resistive region 104 may extend horizontally throughout substrate 102, and/or may be formed selectively under locations where active materials are formed, examples of which are discussed elsewhere herein. In further implementations, resistive region 104 may include oxygen doping to form a dielectric insulator or a buried oxide ("BOX") layer underneath substrate 102 to electrically isolate overlying active semiconductor materials. In further implementations, resistive region 104 may include other implanted elements or molecules such as Ge, N, or Si. However embodied, resistive region 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have resistive region 104, and/or multiple resistive regions 104 may be formed within substrate 102 at different depths. An example of such an implementation is shown in FIG. 15 and discussed elsewhere herein. Additionally, various conductive particles ("dopants") may be introduced into substrate 102 via a process known as "pre-doping" of substrate 102 above resistive region 104.

Methods according to the disclosure may include removing selected portions of substrate 102 with a mask 106 to form a set of trenches 108. Reactive ion etching (RIE) with mask 106 in place on substrate 102 is one technique suitable to form trenches 108, where dielectric materials may be formed. Etching generally refers to the removal of material from a substrate (or structures formed on the substrate), and is often performed with patterned materials such as mask 106 in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features suitable to create similar elements, e.g., vertically extending rounded electrodes as discussed herein.

Figure 2:
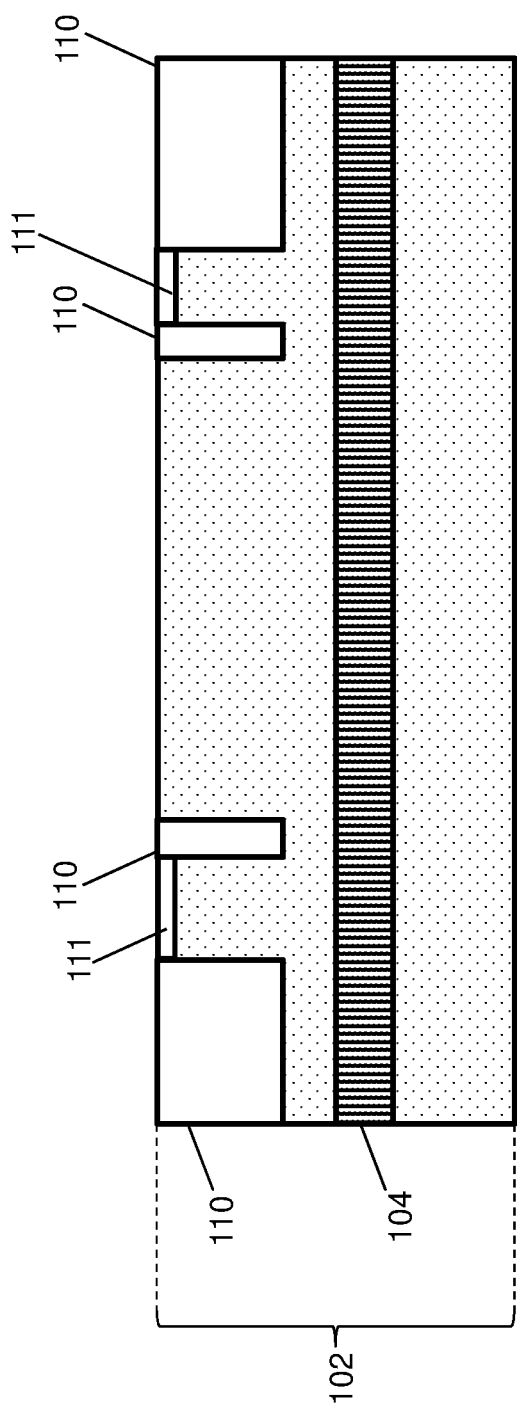
FIG. 2 provides a cross-sectional view of forming trench isolation (TI) regions within the IC structure according to embodiments of the disclosure.

Turning to FIG. 2, embodiments of the disclosure may include forming a set of trench isolations (TIs) 110 within trenches 108 (FIG. 1). TI(s) 110 may be formed by filling trenches 108 with an insulating material such as oxide, to isolate one region of substrate 102 from an adjacent region of substrate 102. Various portions of an IC structure, including the active semiconductor materials of a BJT and/or other devices where applicable, may be disposed within an area isolated by TI(s) 110. According to one example, four TIs 110 are formed, with three portions of substrate 102 being horizontally between respective pairs of the four TIs. One portion of substrate 102 may be processed to form the doped regions of a BJT, while other portions of substrate 102 may be processed to form a conductive coupling to one terminal of the BJT structure. TIs 110 may be formed before active materials are formed within substrate 102, but this is not necessarily true in all implementations. Each TI 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. Additionally, a set of pad insulators 111 may be formed on portions of semiconductor material horizontally between TIs 110, to protect such regions of semiconductor material from being removed and/or targeted for selected epitaxial growth in subsequent operations. Pad insulators 111 may have a thickness of no more than approximately twenty-five nanometers (nm). Controlling the thickness of pad insulator 111 can allow subsequent doping of semiconductor materials thereunder.

Figure 3:
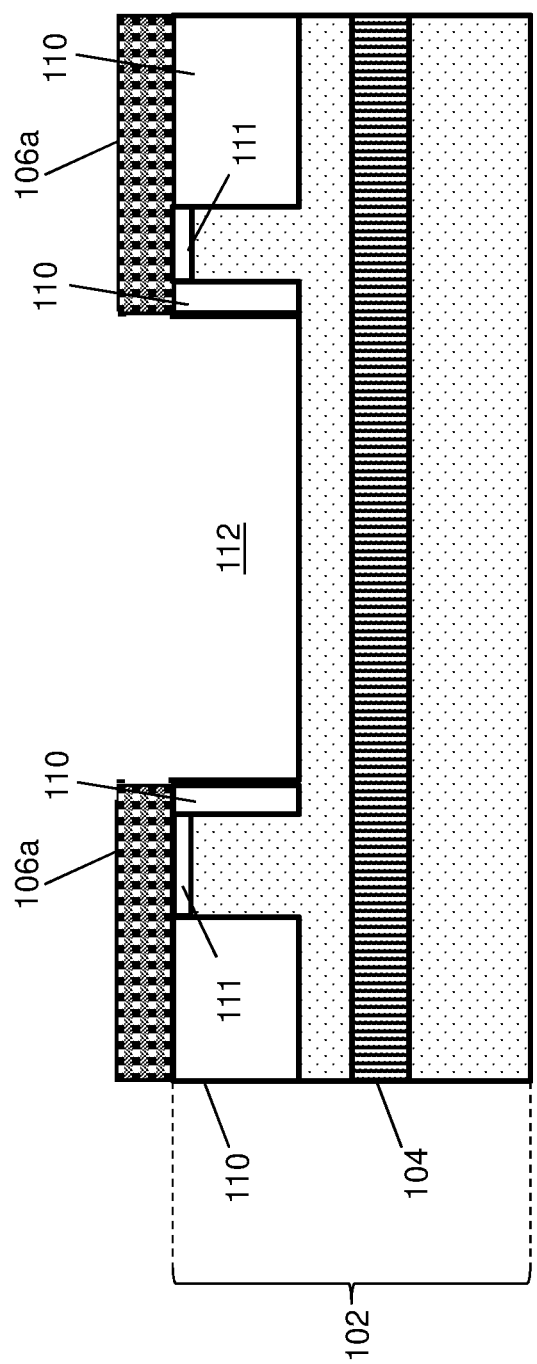
FIG. 3 provides a cross-sectional view of forming an opening within the substrate according to embodiments of the disclosure.

Turning to FIG. 3, embodiments of the disclosure may include forming an opening 112 within substrate 102. Reactive ion etching (RIE) with mask 106a in place on substrate 102 is one technique suitable to form opening 112 within substrate 102. The forming of opening 112 may be controlled such that opening 112 exposes a portion of substrate 102 above resistive region 104. Opening 112 may be horizontally between TIs 110, and may be structured for the forming of a stack of bipolar junction transistor (BJT) terminals in subsequent processing. In some cases, opening 112 may have the same depth within substrate 102 as TIs 110. As compared with other processing paradigms to form vertical BJT structures, the collector, base, and emitter layers of a vertical BJT each may be positioned within opening 112 and thus within substrate 102. Some extrinsic base regions of the BJT may also be formed within substrate 102, while other extrinsic base materials may be at least partially outside and above substrate 102.

Figure 4:
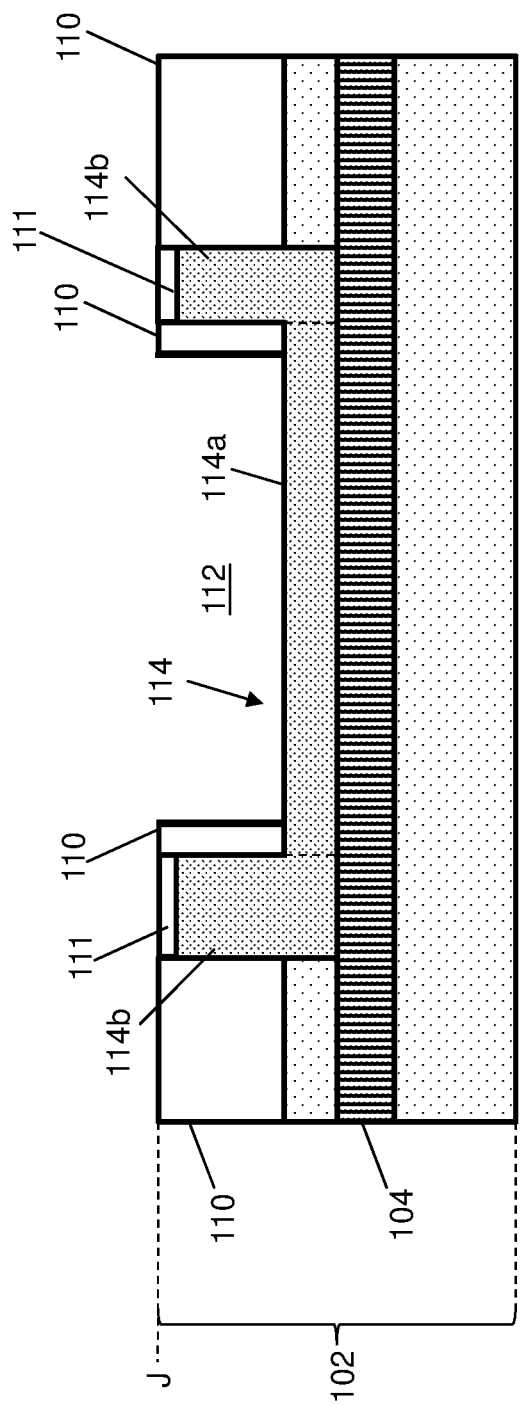
FIG. 4 provides a cross-sectional view of forming a doped semiconductor region within the substrate according to embodiments the disclosure.

Turning to FIG. 4, continued processing may include initial doping of substrate 102 through opening 112 to form a doped semiconductor region 114. The introducing of dopants into substrate 102 in some cases may not be impeded by the presence of pad insulators 111 of relatively small thickness, as noted elsewhere herein. Forming doped semiconductor region 114 may prepare substrate 102 for the forming of active semiconductor materials in a BJT stack. The initial doping of substrate 102 to form doped semiconductor region 114 may be P-type or N-type in a relatively low concentration, compared to subsequently-formed doped materials. P-type dopants refer to elements introduced into substrate 102 to generate free holes by "accepting" electrons from a semiconductor atom and consequently "releasing" the hole. The acceptor atom must have one valence electron less than the host semiconductor. P-type dopants suitable for use in substrate 102 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide ($SiO_2$), and hence, the oxide cannot be used as a mask during Ga diffusion. N-type dopants are elements introduced into semiconductor materials to generate free electrons, e.g., by "donating" an electron to the semiconductor. N-type dopants must have one more valance electron than the semiconductor. Common N-type donors in silicon (Si) include, e.g., phosphorous (P), arsenic (As), and/or antimony (Sb).

In an example implementation, doped semiconductor region 114 is doped with N-type dopants using masking layer 106a shown in FIG. 3, although doped semiconductor region 114 may be doped P-type in other implementations. Although doped semiconductor region 114 has a uniform distribution of dopants, different regions of doped semiconductor region 114 may be structurally distinct. For instance, a first portion 114a of doped semiconductor region 114 may be the portion of doped semiconductor region 114 vertically beneath opening 112, and TI(s) 110 where applicable. A second portion 114b of doped semiconductor region 114 may be horizontally adjacent first portion 114a, and may extend vertically from an upper surface J of substrate 102 to a predetermined depth. In an example, first portion 114a extends within substrate 102 from upper surface J to resistive region 104. Portions 114a, 114b of doped semiconductor region 114 may be formed using different instances of doping (e.g., two implantations). Dashed lines separate first portion 114a from second portion 114b in the accompanying FIGS. with dashed lines to indicate their locations. However, it is understood that the structural composition of doped semiconductor region 114 may be uniform throughout first portion 114a and second portion 114b.

Figure 5:
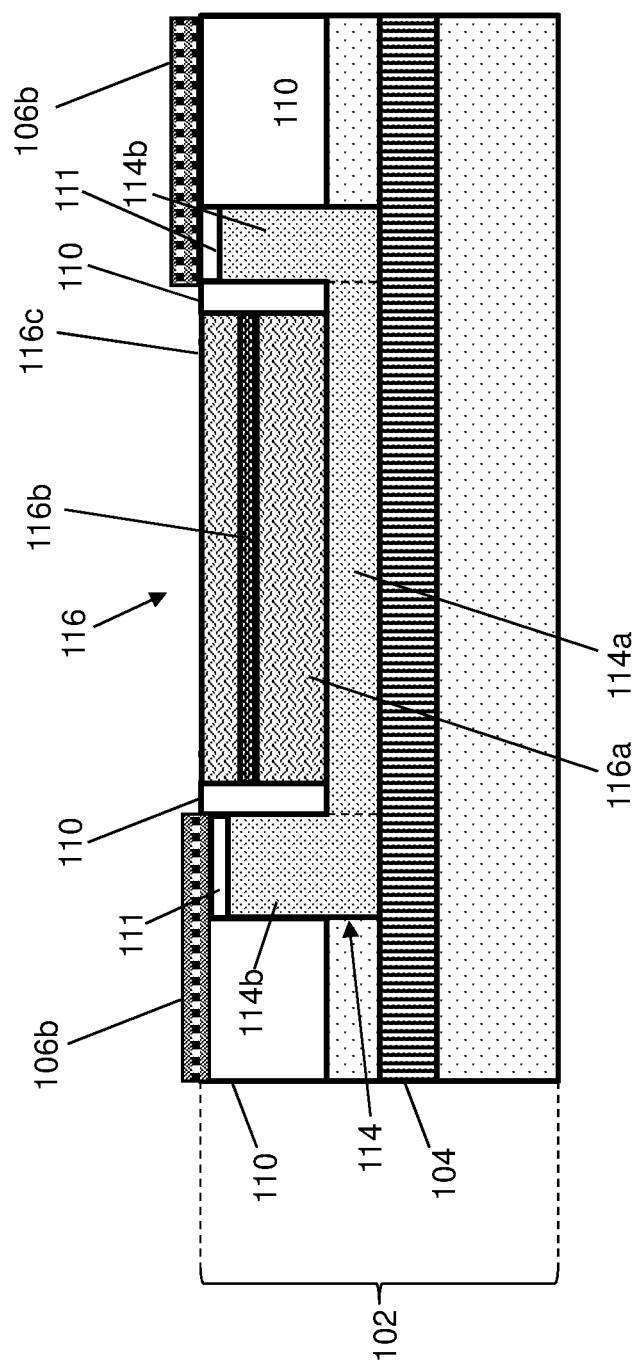
FIG. 5 provides a cross-sectional view of forming a bipolar transistor stack within the substrate according to embodiments of the disclosure.

Turning now to FIG. 5, a patterned masking layer 106b is formed by depositing a dielectric such as SiN, lithographically patterning openings, etching the dielectric, and stripping the remaining photoresist material. Embodiments of the disclosure include selectively forming alternately doped semiconductor materials to form an N-P-N or P-N-P junction, and thus the active regions of a vertical BJT. Continued processing thus may include forming a BJT stack 116 on first portion 114a of doped semiconductor region 114, and within opening 112 (FIG. 4). BJT stack 116 may be formed, e.g., by deposition and/or epitaxial growth of silicon germanium (SiGe), e.g., as a single layer, within opening 112. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The forming of BJT stack 116 may be implemented by selective deposition of silicon germanium (SiGe) or similar materials, optionally with a mask (not shown) in place over other portions of substrate 102 to prevent the forming of active semiconductor material thereon. BJT stack 116 may include a collector 116a, which may be doped N-type or P-type and more specifically may have the same polarity as doped semiconductor region 114 thereunder. Collector 116a may have less doping than doped semiconductor region 114, and may be doped in situ during its deposition and growth within opening 112. Next, a base 116b of BJT stack 116 may be formed on collector 116, e.g., by selective deposition and etching on collector 116a. Base 116b may also be formed of SiGe or other semiconductor materials, and may have an opposite doping type with respect to collector 116a, e.g., by being P-type when collector 116a is N-type or vice versa. As with collector 116a, base 116b may be doped in situ to any desired concentration. An emitter 116c may be formed on base 116b by deposition and/or epitaxial growth, and emitter 116c may have the same doping type as collector 116a of BJT stack 116. Emitter 116c may be doped to any desired concentration, and may have approximately the same doping concentration as collector 116a. The emitter 116c material may be pre-doped, or may be doped in situ following epitaxial growth. Some portions of doped semiconductor material within BJT stack 116 may be removed in subsequent processing as discussed herein. Together, collector 116a, base 116b, and emitter 116c may form an N-P-N or P-N-P junction as a result of their forming and doping, and thus define the three active terminals of a vertical BJT.

Figure 6:
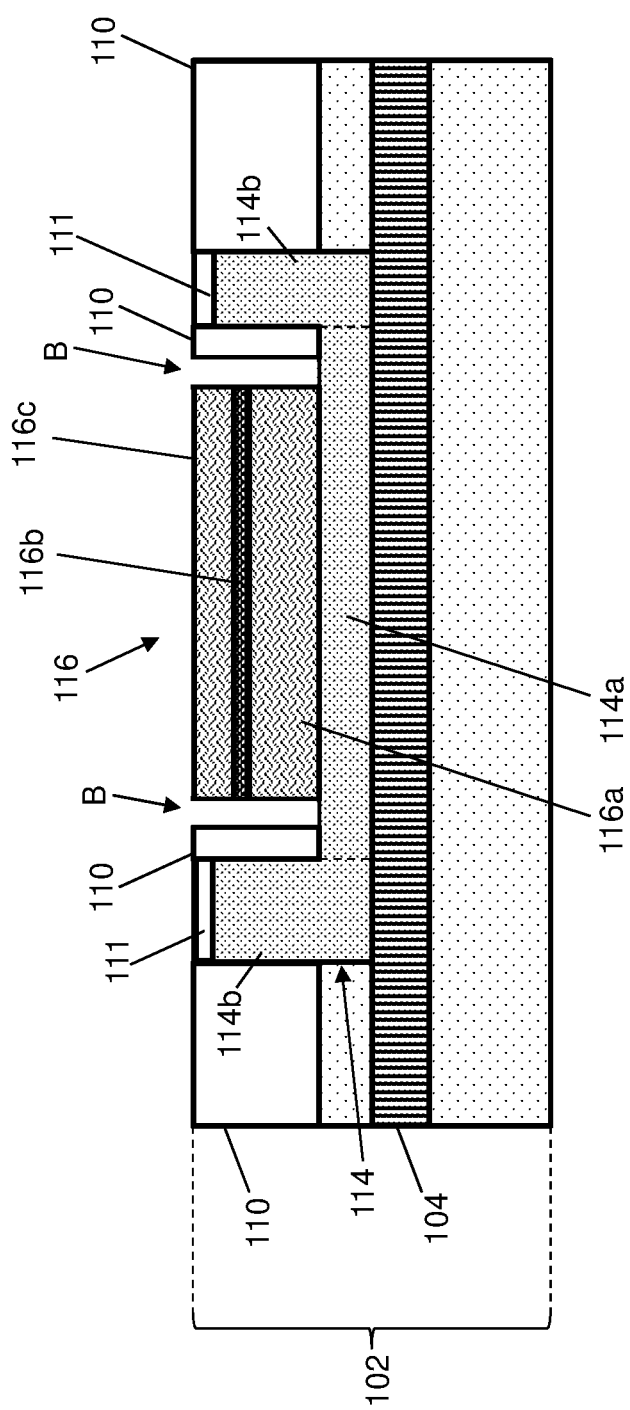
FIG. 6 provides a cross-sectional view of forming openings within the bipolar transistor stack according to embodiments of the disclosure.
Figure 7:
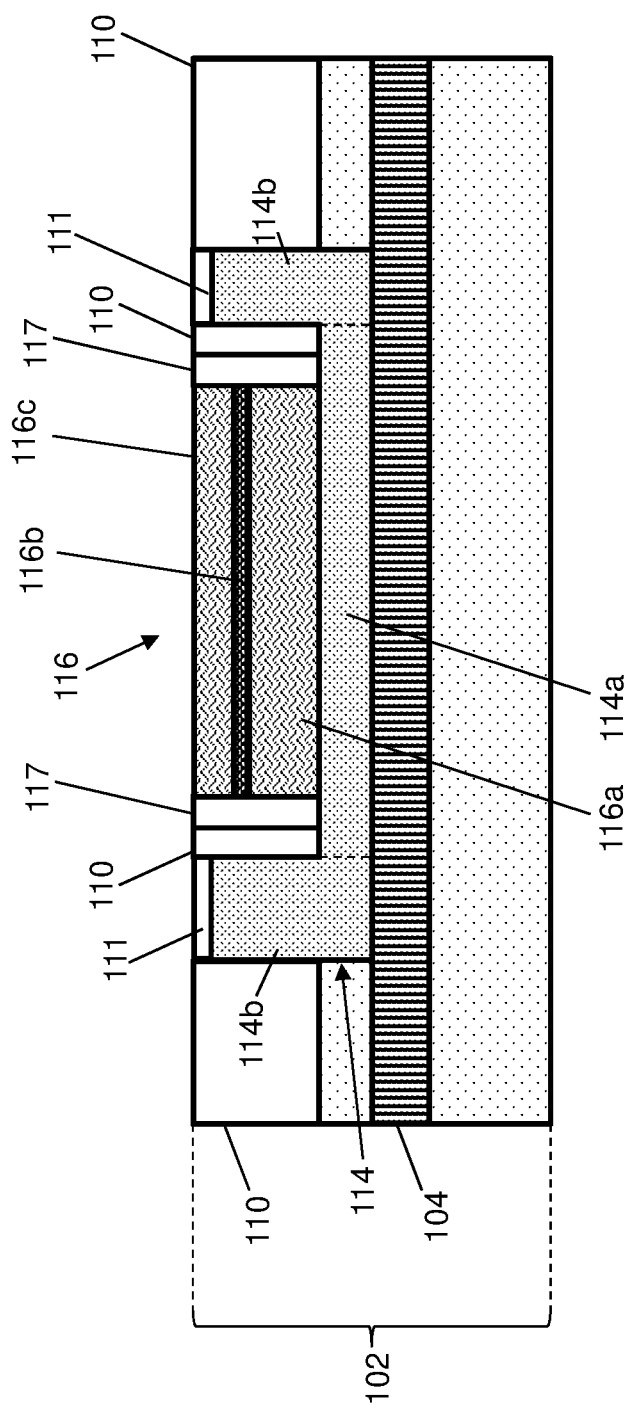
FIG. 7 provides a cross-sectional view of forming a second TI region alongside the bipolar transistor stack according to embodiments of the disclosure.

FIGS. 6 and 7 depict an optional process to remove selected portions of BJT stack 116 to form additional insulative materials. These selectively removed portions of the BJT could have crystal defects formed during the selective epitaxial growth, which could degrade BJT functionality or reliability. For example, FIG. 6 depicts forming a set of openings B (FIG. 6 only) in opposite lateral ends of BJT stack 116, thus exposing first portion 114a of doped semiconductor region 114 thereunder. Openings B may be horizontally between previously-formed TI(s) 110, and remaining portions of collector 116a, base 116b, and emitter 116c. Openings B may be formed my depositing a mask (not shown) and removing, e.g., by RIE or other etching, of exposed portions of BJT stack 116. Additional insulative material(s) may be formed within opening(s) B to form a set of additional TI(s) 117, horizontally between TI(s) 110 and BJT stack 116. Additional TI(s) 117 may include any conceivable insulative material, including one or more of those discussed herein relative to TI(s) 110. Additional TI(s) 117 thus may have the same material composition as TI(s) 110 in some implementations. In this case, however, a physical boundary between TI(s) 110 and additional TI(s) 117 may be detectable, e.g., due to possible time differences for when each TI 110, additional TI 117, material is formed. Upon being formed, TI 110 and additional TI 117 may horizontally surround adjacent structural components. For instance, additional TI 117 may horizontally surround and thus enclose BJT stack 116, while TI 110 may horizontally surround and thus enclose additional TI 117. The portions of TI 110 and additional TI 117 shown in FIG. 7 thus each may be portions of a single region of material.

Figure 8:
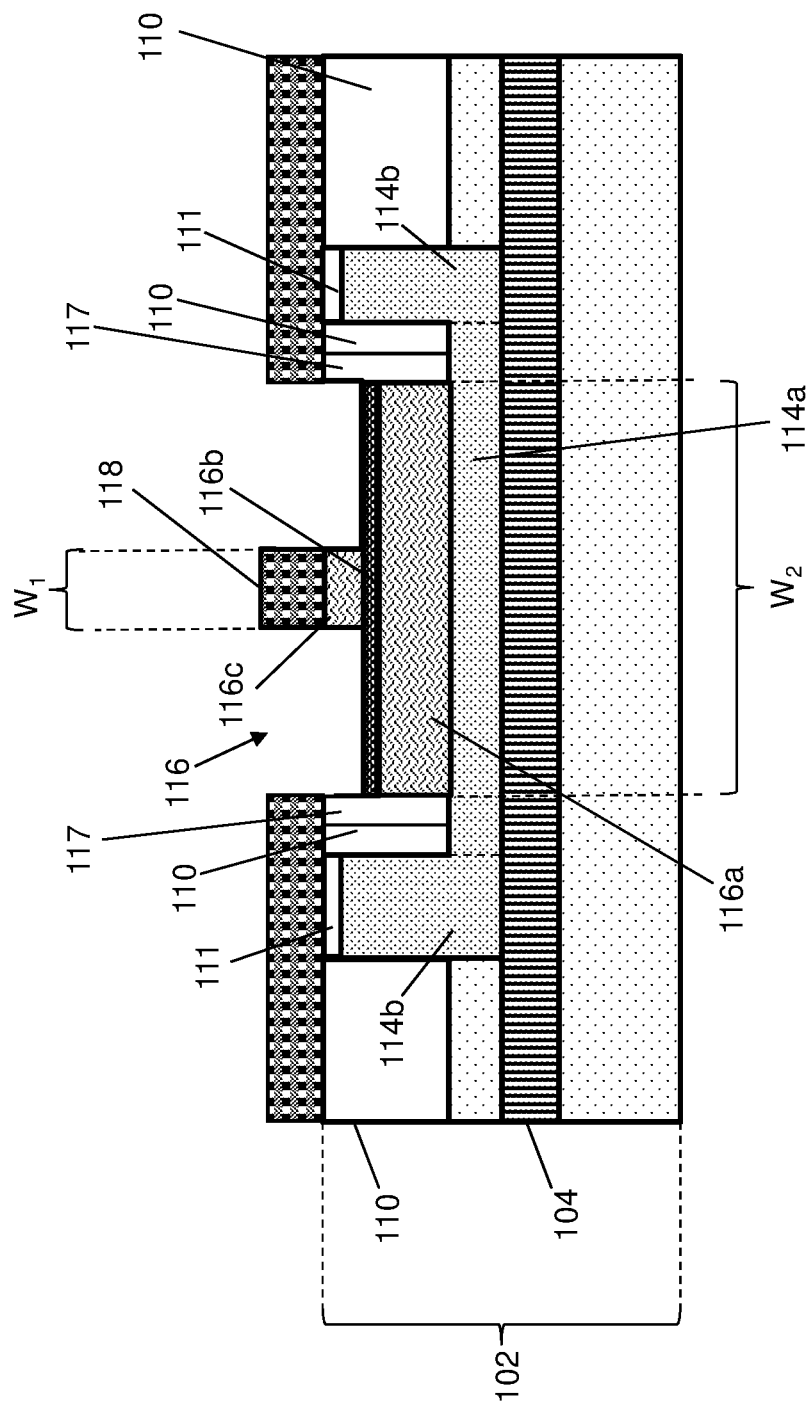
FIG. 8 provides a cross-sectional view of removing portions of an emitter to decrease its width according to embodiments of the disclosure.

Turning to FIG. 8, Portions of BJT stack 116 may be removed to allow electrical terminals to be formed on base 116b. Initially, emitter 116c may entirely cover base 116b of BJT stack 116. Continued processing may include forming an emitter mask 118 on emitter 116c. Emitter mask 118 may have a horizontal width $W_1$ that is less than a horizontal width $W_2$ of base 116b. With emitter mask 118 in place, portions of emitter 116c that are not covered by emitter mask 118 may be removed (e.g., by vertical RIE or other etching techniques), such that emitter 116c also has horizontal width $W_1$ that is less than width $W_2$ of base 116b. Removing portions of emitter 116c may expose portions of base 116b, to allow subsequent forming of extrinsic base materials.

Figure 9:
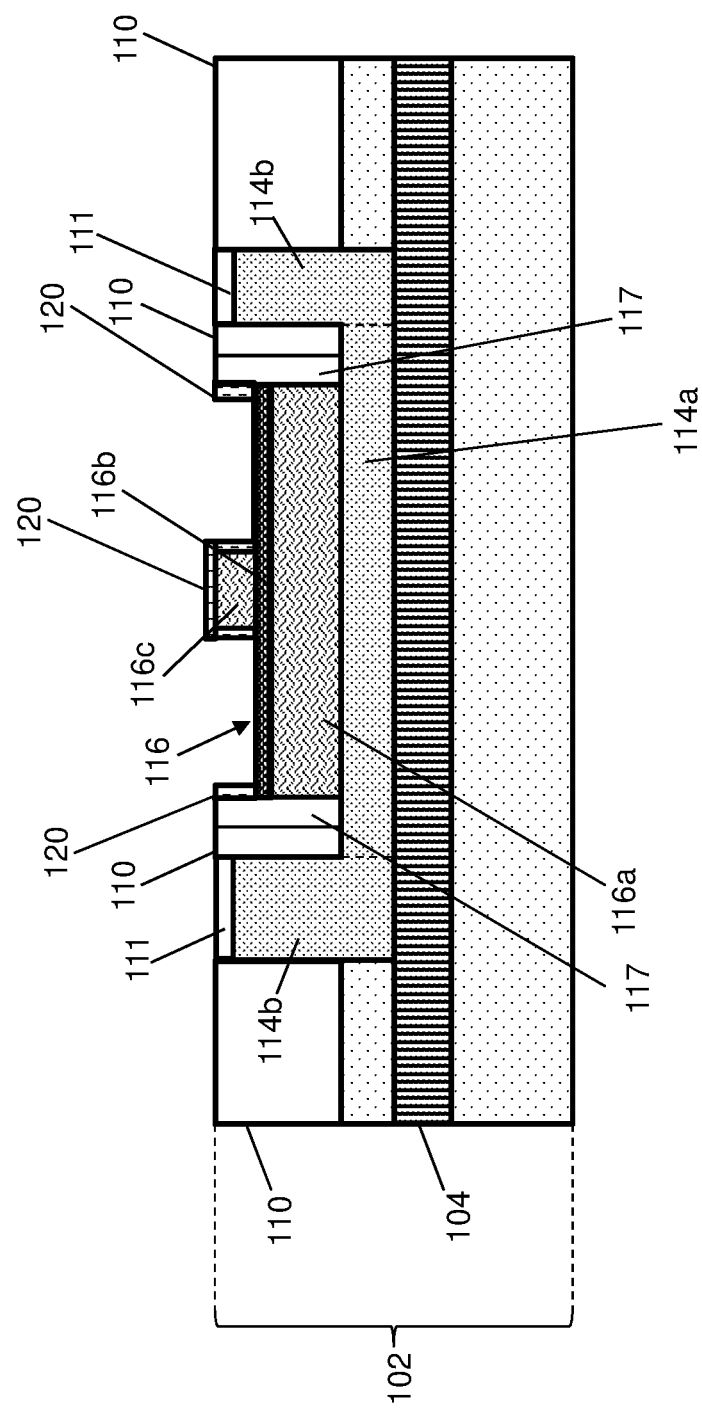
FIG. 9 provides a cross-sectional view of forming a spacer liner according to embodiments of the disclosure.

Referring now to FIG. 9, continued processing may include forming a spacer liner 120 on sidewalls and an upper surface of emitter 116c, e.g., by conformal deposition and etching on exposed surfaces of emitter 116c. Spacer liner 120 may be formed of a nitride insulator and/or other insulator materials described elsewhere herein with respect to TI(s) 110, 117 and/or other insulative materials. Spacer liner 120 also may be formed, e.g., on sidewalls of TI(s) 110, 117 above base 116b. Other portions of spacer liner 120 formed on exposed portions of TI(s) 110, 117, pad insulator(s) 111, base 116b, etc., may be removed by vertical etching. Such vertical etching may be implemented with a mask (not shown) over emitter 116c to prevent removing of spacer liner 120 from emitter 116c. Spacer liner(s) 120, once formed, electrically separates emitter 116c from other materials formed on base 116b.

Figure 10:
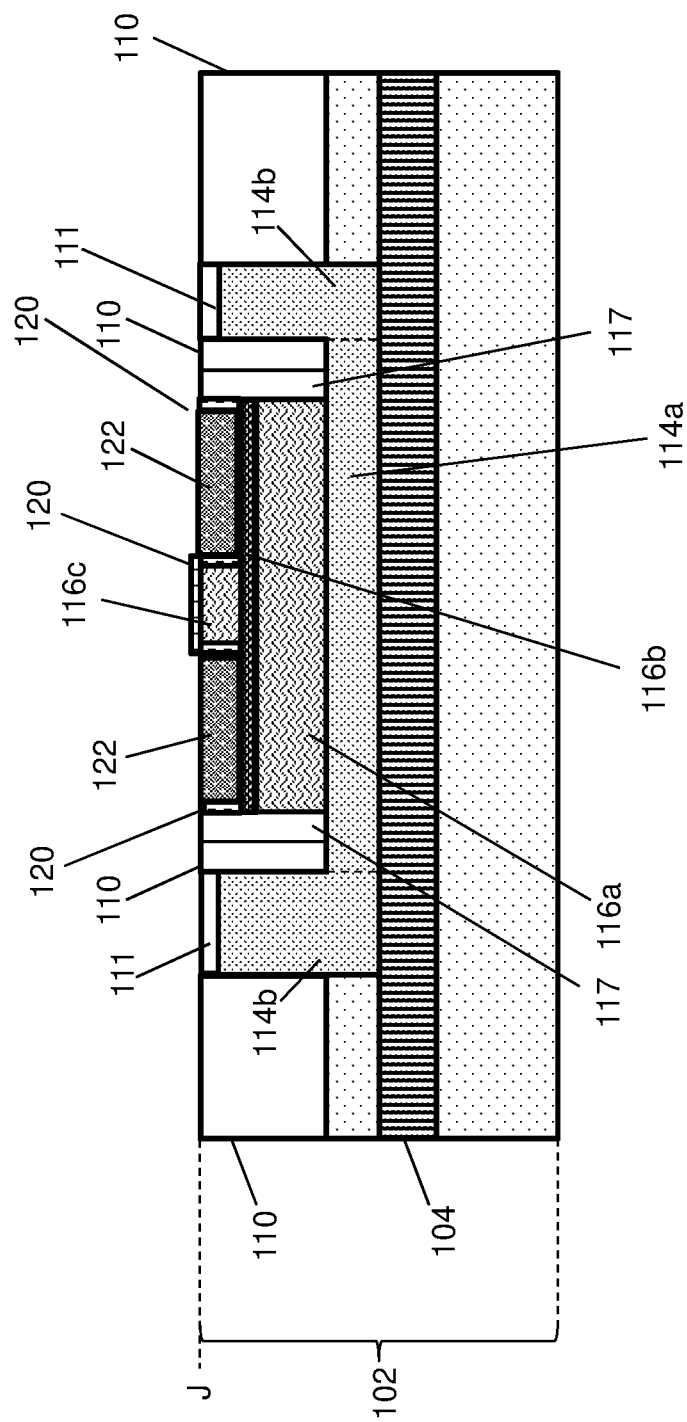
FIG. 10 provides a cross-sectional view of forming a pair of first extrinsic bases according to embodiments of the disclosure.

FIG. 10 depicts the forming of one or more first extrinsic bases 122 on intrinsic base 116b, where portions of emitter 116c were previously removed. First extrinsic base(s) 122 may be formed by deposition and/or epitaxial growth of silicon and/or other semiconductor materials, and may be of the same doping type as base 116b thereunder. First extrinsic base(s) 122, however, may have a higher concentration of dopants than base 116b (also known as an "intrinsic base" to distinguish from extrinsic base(s) 122). The higher doping concentration in first extrinsic base(s) 122 may increase electrical conductivity between base 116b and any contacts coupled to first extrinsic base(s) 122 for controlling the flow of current through BJT stack 116. Despite the higher concentration of dopants, first extrinsic base(s) 122 may have the same material composition as BJT stack 116, and thus may include SiGe. While first extrinsic base(s) 122 are being formed, a set of masks (not shown) may be formed on TI(s) 110, pad insulator(s) 111, spacer liner 120, and/or other materials. When such masks are used, first extrinsic base(s) 122 may be formed by selective epitaxial growth of additional semiconductor material on exposed portions of base 116b. In this case, first extrinsic base(s) 122 may have upper surfaces that are substantially coplanar with upper surface J of substrate 102, TI(s) 110, 117, and/or doped semiconductor region 114 after being formed. When first extrinsic base(s) 122 is/are formed by selective growth, they may be planarized by use of chemical mechanical planarization (CMP) such that their upper surfaces are substantially coplanar with upper surface J.

Figure 11:
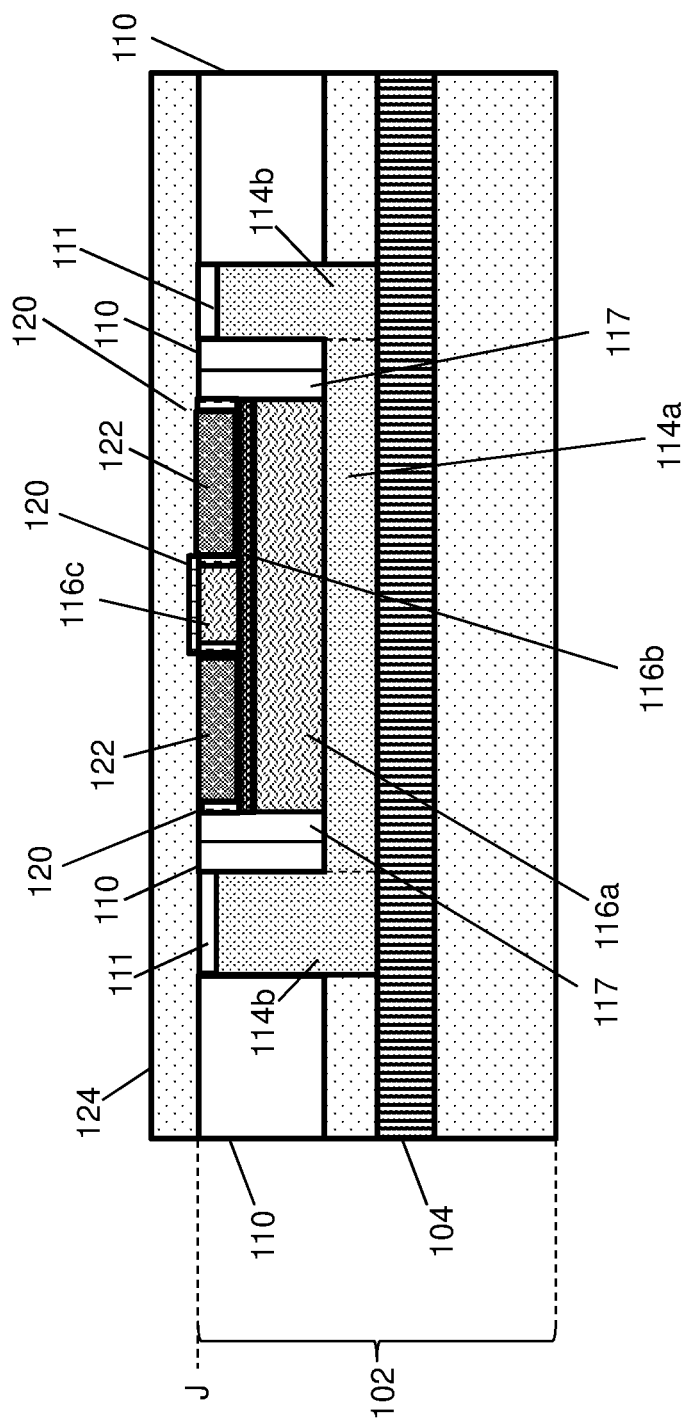
FIG. 11 provides a cross-sectional view of forming an additional semiconductor layer according to embodiments of the disclosure.

Turning to FIG. 11, an additional semiconductor layer 124 may be formed on substrate 102, TI(s) 110, 117, doped semiconductor region 114, emitter 116c, and first extrinsic base(s) 122. Additional semiconductor layer 124 can be patterned into a set of second extrinsic bases 126 (FIG. 12) on first extrinsic base(s) 122. Additional semiconductor layer 124 may be formed as a single layer, e.g., by deposition. In this case, portions of additional semiconductor layer 124 may contact first extrinsic base(s) 122 thereunder, to form a vertical junction between first extrinsic base(s) 122 and additional semiconductor layer 124. Additional semiconductor layer 124, which may include the same material as substrate 102 and/or a different material, and may be processed into second extrinsic base regions 126. According to an example, additional semiconductor material 124 may include, e.g., a deposited layer of polycrystalline silicon (poly-Si). In this case, the poly-Si material may be doped after being deposited to have the same polarity as first extrinsic base(s) 122 thereunder. In this case, however, additional semiconductor material 124 may have a different material composition as first extrinsic base(s) 122, despite being of the same doping polarity and/or having a similar dopant concentration.

Figure 12:
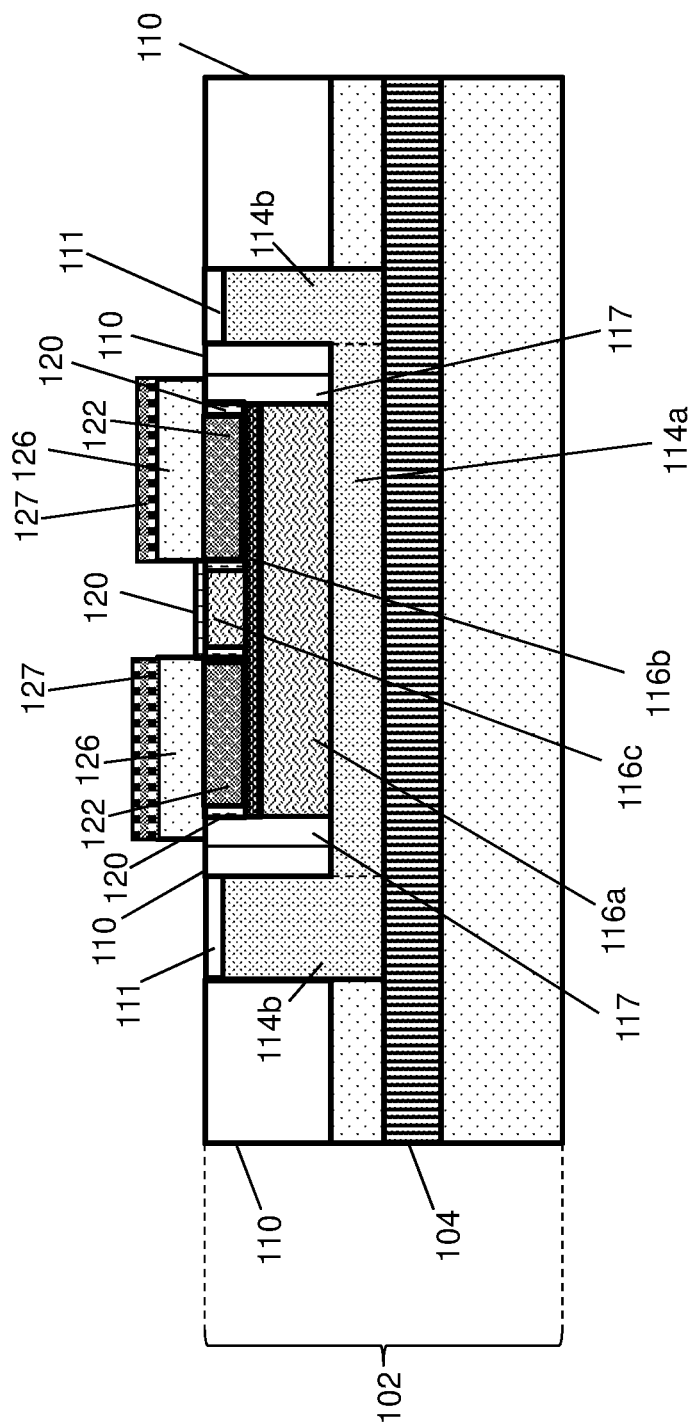
FIG. 12 depicts a cross-sectional view of removing portions of the additional semiconductor layer to form second extrinsic bases according to embodiments of the disclosure.

Referring to FIGS. 11 and 12 together, portions of additional semiconductor layer 124 (FIG. 11) may be patterned into second extrinsic bases 126 by forming a set of masks 127 (FIG. 12) on additional semiconductor layer 124. With masks 127 in place, portions of semiconductor layer 124 that are not covered by masks 127 may be removed by etching of semiconductor material. The prior forming of pad insulators 111 on second portion 114b of doped semiconductor region 114 may prevent semiconductor region 114 from also being etched when targeted portions of additional semiconductor layer 124 are removed. Thus, additional semiconductor region 124 may be patterned into second extrinsic base(s) 126 over first extrinsic base(s) 122. The remaining portions of additional semiconductor layer 124 over first extrinsic base(s) 122 thus become one or more second extrinsic bases 126. Each second extrinsic base 126 is positioned over a respective first extrinsic base 122. Forming second extrinsic base(s) 126 in this manner causes second extrinsic base(s) 126 to be vertically above substrate 102 and materials formed therein, including TI(s) 110, 117, doped semiconductor region 114, emitter 116c, first extrinsic base(s) 124, etc. The forming of second extrinsic base(s) 126 allows contacts to be formed to BJT stack 116 and first extrinsic base(s) 122 in subsequent processing. Although second extrinsic base region 126 is shown to completely cover first extrinsic base region 122, it is possible that it only partially covers first extrinsic base region 122.

Figure 13:
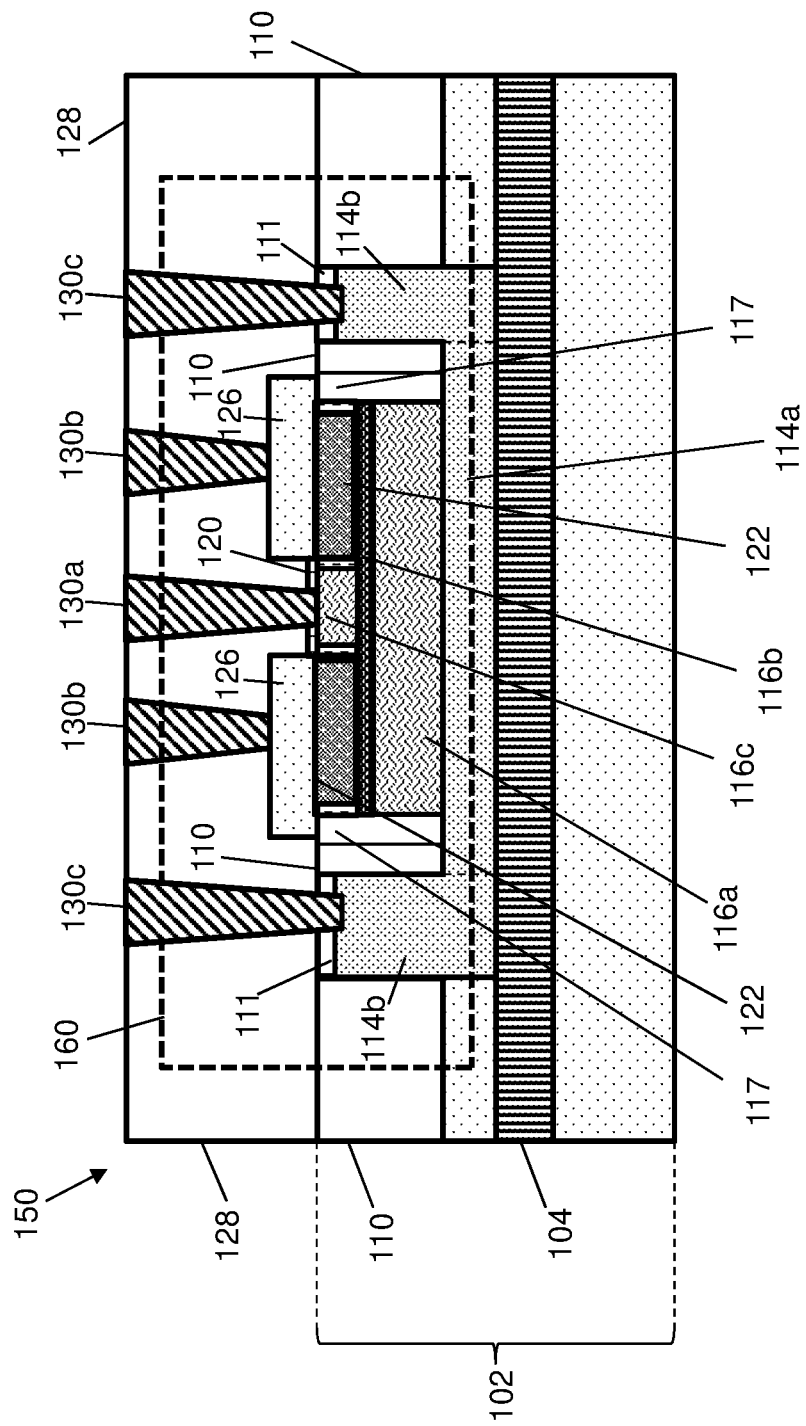
FIG. 13 provides a cross-sectional view of an IC structure according to embodiments of the disclosure.

FIG. 13 depicts the forming of an inter-level dielectric (ILD) layer 128 above substrate 102; including TI(s) 110, 117 and doped semiconductor region 114, as well as BJT stack 116 and second extrinsic base(s) 126. ILD layer 128 may be formed, e.g., by deposition or other techniques of forming an insulative material on a structure. ILD layer 128 may include the same insulating material as TI(s) 110, 117, or may include a different electrically insulative material. ILD layer 128 and TI(s) 110, 117 nonetheless constitute different components, e.g., due to TI(s) 110, 117 being formed within portions of substrate 102 instead of being formed thereon. In further embodiments (not shown), a silicide layer as known in the art could be formed on the exposed semiconductor surfaces prior to ILD layer 128 deposition. For example, a Co, Ti, NI, Pt, or similar self-aligned silicide (silicide) could be formed prior to ILD layer 128 deposition. Additional metallization layers (not shown) may be formed on ILD layer 128 during middle-of-line and/or back-end-of-line processing. To electrically couple various components discussed herein to such metallization layers, an emitter contact 130a may be formed on emitter 116c of BJT stack 116 and within ILD 130. Portions of spacer liner 120 on the upper surface of emitter 116c may be removed by vertical etching (e.g., by RIE) as emitter contact 130a is formed, while other portions of spacer liner 120 may remain intact. Similarly, one or more base contacts 130b may be formed on second extrinsic base(s) 126 and within ILD 130. Additionally, one or more collector contacts 130c may be formed on doped semiconductor region 114 (e.g., at second portion 114b thereof), by etching portions of ILD layer 128 and pad insulators 111 to expose second portions 114b of doped semiconductor region 114 thereunder. At this stage, doped semiconductor region 114 electrically couples collector contact(s) 130c to collector 116a.

One or more of contacts 130a, 130b, 130c to overlying circuit elements may be formed within predetermined portions of ILD layer 128 by a controlled amount of vertical etching to form openings to one or more contact sites, and then filling the openings with a conductor. Each contact 130a, 130b, 130c may include any currently known or later developed conductive material configured for use in an electrical contact, e.g., copper (Cu), aluminum (Al), gold (Au), etc. Contacts 130a, 130b, 130c may additionally include refractory metal liners (not shown) positioned alongside ILD layer 128 to prevent electromigration degradation, shorting to other components, etc. Additionally, selected portions of doped semiconductor region 114, emitter 116c, and second extrinsic base(s) 126 may include silicide regions (i.e., portions of semiconductor that are annealed in the presence of an overlying conductor to increase the electrical conductivity of semiconductor regions) to increase the electrical conductivity at their physical interface with contact(s) 130a, 130b, 130c, where applicable.

Embodiments of the disclosure provide an IC structure 150, in which doped semiconductor region 114, BJT stack 116, first extrinsic base 122, and second extrinsic base 126 together define the components of a vertical BJT 160. Applying a current to base 116b through extrinsic bases 122, 126 thereover controls the ability for current to flow from collector 116a to emitter 116c. As discussed herein, base 116b may have a lighter doping concentration than extrinsic bases 122, 126 to control the sensitivity of base 116b to electrical currents within base contact(s) 130b. Extrinsic bases 122, 126 have a substantially higher doping concentration than base 116b, and in the case of second extrinsic base 126 may have a different material composition (e.g., as a result of the separate forming and/or doping operations discussed herein). Second extrinsic base(s) 126 additionally may be at least partially located above substrate 102 and various components formed therein.

Figure 14:
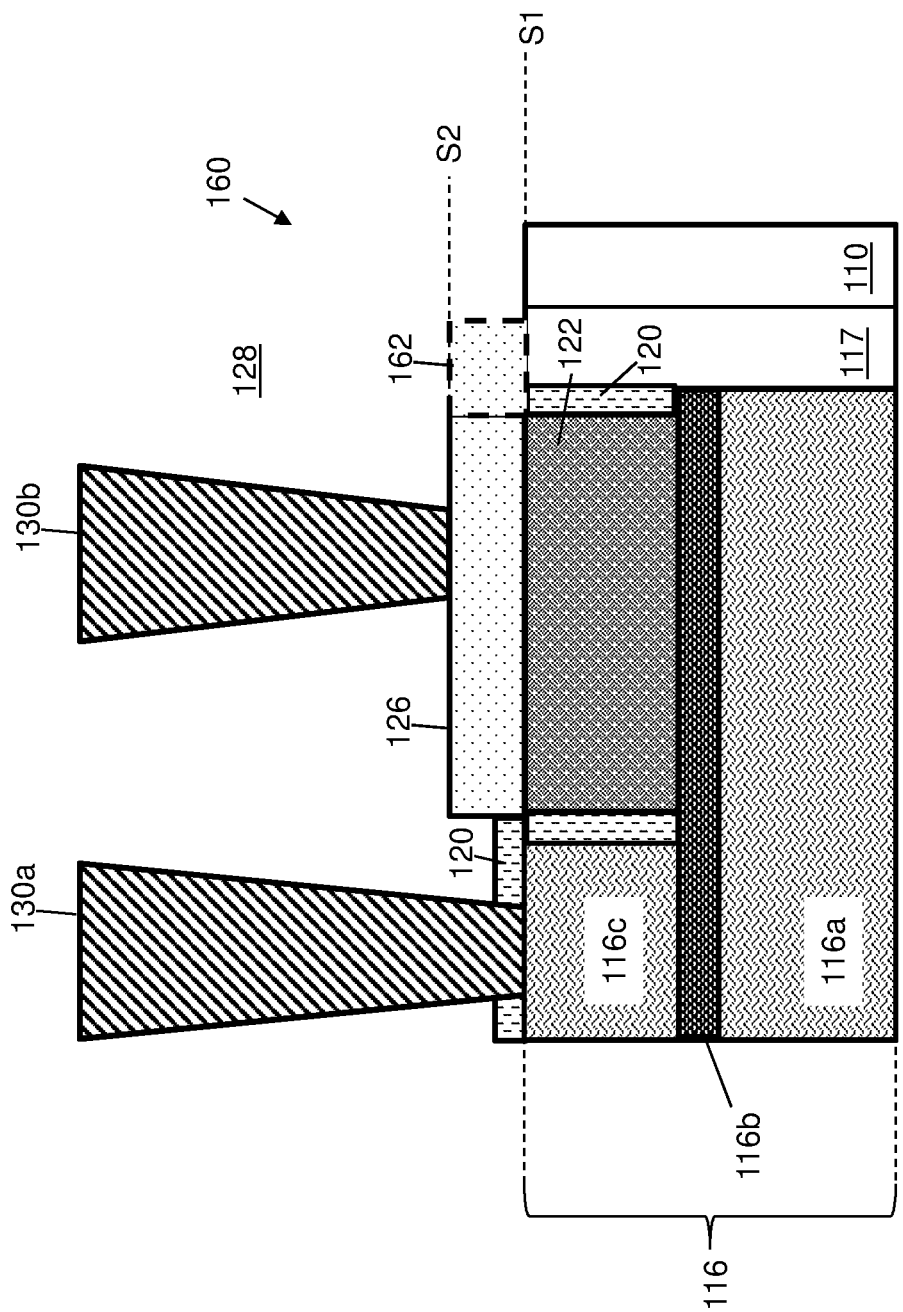
FIG. 14 provides an expanded cross-sectional view of the first and second extrinsic base in an IC structure according to embodiments of the disclosure.

FIG. 14 depicts an expanded cross-sectional view of vertical BJT 160, including BJT stack 116, first extrinsic base 122, and second extrinsic base 126. In some implementations, second extrinsic base 126 may include an outer portion 162 (shown with dashed lines) representing doped semiconductor material that is not removed from TI(s) 110, 117, spacer liner(s) 120, and/or other materials located alongside first extrinsic base 122. Nevertheless, a lower surface S1 of second extrinsic base 126 on first extrinsic base 124 may be substantially coplanar with upper surface S1 of first extrinsic base 124, and substrate 102. Additionally, an upper surface S2 of second extrinsic base 126, including outer portion 162, may be vertically above upper surface S1 of substrate 102. In this configuration, second extrinsic base 126 may be characterized as a "raised extrinsic base," referring to portions of extrinsic base material that are formed above substrate 102. This configuration allows highly doped semiconductor material of extrinsic bases 122, 126 to be formed within and above substrate 102, while BJT stack 116 including collector 116a, base 116b, and emitter 116c, as well as first extrinsic base 124, are formed within substrate 102, e.g., below upper surface S1 thereof.

Referring to FIGS. 13 and 15 together, IC structure 150 may include vertical BJT 160 in substrate 102, together with a field effect transistor (FET) 164. The cross-sectional view of IC structure 150 in FIG. 12 shows substrate 102 as a single layer, with TI(s) 110 horizontally separating vertical BJT 160 from FET 164. The area of substrate 102 where BJT 160 is formed may define a first portion 102a of substrate 102. The area of substrate 102 where FET 164 is formed by define a second portion 102b of substrate 102. FET 164 may be formed to include a gate structure 166. The forming of FET 164 may cause gate structure 166 to have an upper surface that is substantially coplanar with an upper surface of second extrinsic base(s) 126 along horizontal line P. Gate structure 166 also may include a lower surface that is substantially coplanar with an upper surface of emitter 116c. The configuration of vertical BJT 160 with second extrinsic base(s) 126 above substrate 102 allows FETs and BJTs to be implemented together in a single device layer, with contact(s) 130a, 130b, 130c to vertical BJT 160 being of similar size to other conductors. For example, contact(s) 130a, 130b, 130c may be of substantially the same, or similar, size to additional contact(s) 130d within ILD layer 128 to gate structure 166 of FET 164.

Figure 16:
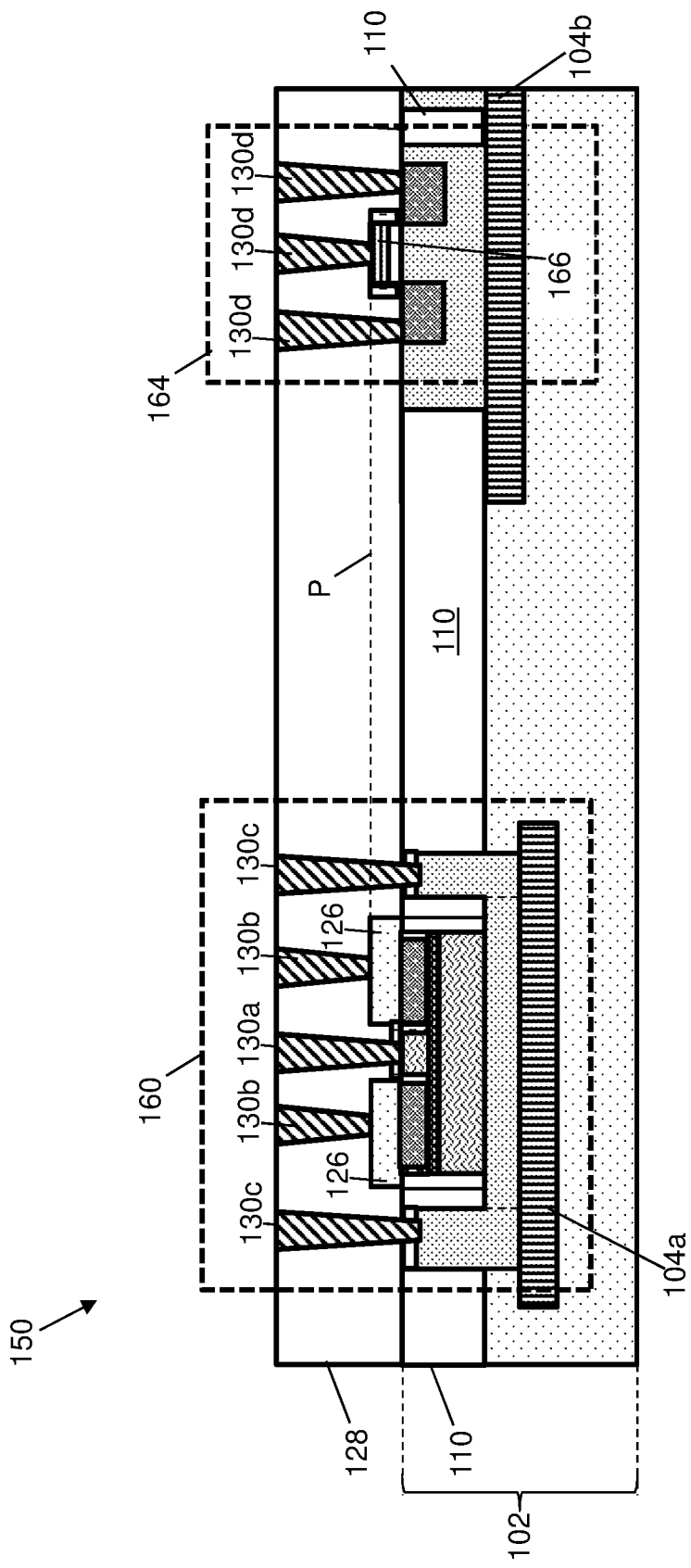
FIG. 16 provides a cross-sectional view of a bipolar transistor and FET in an IC structure according to additional embodiments of the disclosure.

Referring to FIGS. 15 and 16, FET 164 may be formed over one or more resistive region(s) 104 of substrate 102, and may have its own doped regions, terminals, contacts, etc., in addition to a FET gate stack or similar components. In the FIG. 15 example, a single resistive region 104 may extend horizontally through substrate 102, with one portion being below vertical BJT 160 and another being below FET 164. In alternative example shown in FIG. 16, substrate 102 may include several resistive regions 104 at different locations within substrate 102, and respectively beneath vertical BJT 160 or FET 164. In the case of multiple resistive regions 104, each resistive region 104 may have a distinct depth within substrate 102 based on the shape of BJT 160 and/or FET 164 thereabove. FIG. 16 shows an example where trench isolation 110 has a lower surface contacting buried resistive region 104 thereunder. In embodiments, for both the FIGS. 15 and 16 structures, trench isolation(s) 110 could contact buried resistive region 104 for the BJT 160, FET 164, or both.

Embodiments of the disclosure provide various technical and commercial advantages, examples of which are discussed herein. Embodiments of the disclosure provide IC structure 150 with vertical BJT 160 in which BJT stack 116 and first extrinsic base 124 are within substrate 102. In this configuration, second extrinsic base 126 is located at least partially above substrate 102. These physical aspects of vertical BJT 160 allow contacts 130a, 130b, 130c thereto to be formed of a similar size to other contacts to FET 164 and/or other components formed elsewhere on the same layer of substrate 102. These physical features of vertical BJT 160 are enabled, in part, by forming doped semiconductor region 114 and BJT stack 116 within an opening of substrate 102, and horizontally alongside TI(s) 110, 117. The sizing of BJT stack 116, moreover, allows BJT stack 116 to be formed with openings that are similarly sized to openings used to form TI(s) 110, 117. Moreover, second extrinsic base 126 may include different materials from those in base 116b and/or first extrinsic base 122, thereby allowing greater control over the sensitivity of vertical BJT 160 to varying voltages at its base terminal.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a bipolar transistor stack within a substrate, the bipolar transistor stack including:
      a collector,
      a base on the collector, and
      an emitter on a first portion of the base, wherein a horizontal width of the emitter is less than a horizontal width of the base;
   an extrinsic base structure on a second portion of the base of the bipolar transistor stack, and horizontally adjacent the emitter, wherein the extrinsic base structure includes an upper surface above an upper surface of the substrate;
   a doped semiconductor region within the substrate, wherein the doped semiconductor region includes a first portion extending vertically from the upper surface of the substrate to a depth below the bipolar transistor stack, and a second portion horizontally adjacent the first portion and below the bipolar transistor stack;
   a first trench isolation (TI) horizontally between the doped semiconductor region and the bipolar transistor stack; and
   a second TI horizontally between and in contact with the bipolar transistor stack and the first TI, wherein the first TI and the second TI have a detectable boundary therebetween.

2. The IC structure of claim 1, wherein a portion of the extrinsic base structure is over the first TI or the second TI.

3. The IC structure of claim 1, further comprising at least one resistive region within the substrate below the bipolar transistor stack, wherein the resistive region includes polycrystalline silicon.

4. The IC structure of claim 1, further comprising a field effect transistor (FET) on a portion of the substrate that is laterally displaced from the bipolar transistor stack, wherein the FET includes a gate structure having an lower surface substantially coplanar with an upper surface of the emitter.

5. The IC structure of claim 1, wherein the extrinsic base structure includes doped polycrystalline silicon (poly-Si).

6. An integrated circuit (IC) structure, comprising:
   a doped semiconductor region within a substrate;
   a first trench isolation (TI) horizontally adjacent the doped semiconductor region,
   a bipolar transistor stack within the substrate, over the doped semiconductor region, and adjacent the first trench isolation (TI) region, the bipolar transistor stack including:
      a collector on the doped semiconductor region,
      a base on the collector, and
      an emitter on a first portion of the base, wherein a horizontal width of the emitter is less than a horizontal width of the base;
   a second TI horizontally between and in contact with the bipolar transistor stack and the first TI, wherein the first TI and the second TI have a detectable boundary therebetween;
   a first extrinsic base on a second portion of the base of the bipolar transistor stack and adjacent the first TI, wherein the first extrinsic base is horizontally adjacent the emitter; and
   a second extrinsic base on the first extrinsic base, wherein the second extrinsic base includes an upper surface above an upper surface of the substrate.

7. The IC structure of claim 6, wherein the doped semiconductor region includes a first portion extending vertically from the upper surface of the substrate to a depth below the bipolar transistor stack, and a second portion horizontally adjacent the first portion and below the bipolar transistor stack.

8. The IC structure of claim 6, further comprising a field effect transistor (FET) on a portion of the substrate that is laterally displaced from the bipolar transistor stack, wherein the FET includes a gate structure having an upper surface substantially coplanar with an upper surface of the second extrinsic base.

9. The IC structure of claim 8, further comprising:
   a third TI horizontally adjacent to the FET, wherein a lower surface of the third TI is on a resistive region within the substrate.

10. The IC structure of claim 9, wherein a portion of the second extrinsic base is over the first TI or the second TI.

11. The IC structure of claim 6, further comprising at least one resistive region within the substrate below the bipolar transistor stack, wherein the resistive region includes polycrystalline silicon.

12. The IC structure of claim 6, wherein the second extrinsic base includes doped polycrystalline silicon (poly-Si).

* * * * *